US012607775B2

(12) United States Patent
Singulani et al.

(10) Patent No.: US 12,607,775 B2
(45) Date of Patent: Apr. 21, 2026

(54) OPTICAL DEVICE WITH PHASE CORRECTION

(71) Applicant: ams AG, Premstätten (AT)

(72) Inventors: Anderson Singulani, Graz (AT); Mai Lijian, Singapore (SG); Jozef Pulko, Premstätten (AT); Gernot Fasching, Vienna (AT); Jean-Francois Pierre Seurin, West Windsor Township, NJ (US); Chuni Ghosh, West Windsor, NJ (US)

(73) Assignee: AMS AG, Premstätten (AT)

( * ) Notice: Subject to any disclaimer, the term of this patent is extended or adjusted under 35 U.S.C. 154(b) by 885 days.

(21) Appl. No.: 17/787,742

(22) PCT Filed: Dec. 16, 2020

(86) PCT No.: PCT/EP2020/086521
§ 371 (c)(1),
(2) Date: Jun. 21, 2022

(87) PCT Pub. No.: WO2021/130085
PCT Pub. Date: Jul. 1, 2021

(65) Prior Publication Data
US 2023/0088107 A1     Mar. 23, 2023

Related U.S. Application Data

(60) Provisional application No. 62/952,544, filed on Dec. 23, 2019.

(51) Int. Cl.
*G02B 1/00*     (2006.01)
*H10F 77/40*    (2025.01)
*H10H 20/855*   (2025.01)

(52) U.S. Cl.
CPC ........... G02B 1/002 (2013.01); H10F 77/413 (2025.01); H10H 20/855 (2025.01)

(58) Field of Classification Search
CPC ................ G02B 1/002; G02B 27/0172; G02B 2207/101; H10F 77/413; H10F 77/40; H10F 39/806; H10H 20/855; H10H 20/856
See application file for complete search history.

(56) References Cited

U.S. PATENT DOCUMENTS

| 3,763,372 A | 10/1973 | Fedotowsky et al. |
| 2015/0219806 A1 | 8/2015 | Arbabi et al. |
| (Continued) | | |

FOREIGN PATENT DOCUMENTS

| CN | 101144907 A | 3/2008 |
| EP | 3112924 A1 | 1/2017 |
| (Continued) | | |

OTHER PUBLICATIONS

Japanese Notification of Reasons for Refusal issued in Japanese Application No. 2022-538863 dated Aug. 8, 2023, with English language translation, 11 pages.

(Continued)

*Primary Examiner* — Thomas A Hollweg
*Assistant Examiner* — Mary A El-Shammaa
(74) *Attorney, Agent, or Firm* — MH2 Technology Law Group LLP

(57)     ABSTRACT

An optical element for introducing a predetermined phase delay into incident electromagnetic radiation. The optical element comprises a first layer and a second layer arranged in a propagation path of a portion of the electromagnetic radiation. The first layer comprises a transmission regions configured to introduce a first phase delay into the portion of electromagnetic radiation propagating therethrough. The (Continued)

second layer comprises a metasurface configured to introduce a second phase delay into the portion of electromagnetic radiation propagating therethrough. The metasurface comprises subwavelength sized structures.

13 Claims, 9 Drawing Sheets

(56)     References Cited

U.S. PATENT DOCUMENTS

| | | | |
|---|---|---|---|
| 2019/0044003 A1 | 2/2019 | Heck et al. | |
| 2019/0049235 A1* | 2/2019 | Han | G02B 5/1842 |
| 2019/0064532 A1 | 2/2019 | Riley, Jr. et al. | |
| 2019/0086682 A1 | 3/2019 | Miller et al. | |
| 2021/0349250 A1 | 11/2021 | Gill et al. | |
| 2025/0185503 A1* | 6/2025 | Ramann | C07D 405/08 |

FOREIGN PATENT DOCUMENTS

| | | | |
|---|---|---|---|
| JP | 2016510910 | A | 4/2016 |
| WO | 0165305 | A1 | 9/2001 |
| WO | 2006102275 | A2 | 9/2006 |
| WO | 2019016596 | A1 | 1/2019 |
| WO | 2019046827 | A1 | 3/2019 |

OTHER PUBLICATIONS

Chinese Office Action issued in Chinese Patent Application No. 202080089767.X dated Dec. 15, 2023, with English language translation, 18 pages.
Frisc, Anna Maria (EP Authorized Officer), International Search Report and Written Opinion in corresponding International Application No. PCT/EP2020/086521 mailed on Apr. 12, 2021, 11 pages.

* cited by examiner

OPTICAL DEVICE WITH PHASE CORRECTION

CROSS-REFERENCE TO RELATED APPLICATIONS

The present application is the national stage entry of International Patent Application No. PCT/EP2020/086521, filed on Dec. 16, 2020, and published as WO 2021/130085 A1 on Jul. 1, 2021, which claims the benefit of priority of U.S. Provisional Application No. 62/952,544, filed on Dec. 23, 2019, all of which are incorporated by reference herein in their entireties.

BACKGROUND OF THE DISCLOSURE

The disclosure relates to optical elements, particularly but not exclusively to optical elements for introducing a predetermined phase delay into incident electromagnetic radiation, and energy sources and detectors having such optical elements.

The interaction of electromagnetic radiation with structures of size comparable to its wavelength produce effects that may be modelled with wave theory framework. By carefully designing such structures and arrangements thereof, the electromagnetic radiation can be manipulated beyond a classical ray theory framework that bends light only by taking advantage of optical material properties such as refractive index. Materials made up of such sub-wavelength structures are known as metamaterials. One or more layers of such sub-wavelength structures arranged on a surface are known as metasurfaces. Electromagnetic radiation or portions thereof incident on the metasurface are scattered by the sub-wavelength structures. By choosing the sizes, thicknesses, positions and/or spacing of the structures of a metasurface according to predetermined design criteria, the effect the metasurface has on electromagnetic radiation propagating therethrough can be controlled. For example, a metasurface might introduce a predetermined phase delay into portions of the electromagnetic radiation to cause constructive interference at predetermined distances from the metasurface. A metasurface which has this effect is known as a metalens.

Despite the known existence of metamaterials and metasurfaces, widespread adoption in industry has been limited in part because of the difficulties of reliably manufacturing metasurfaces on a large scale and at low cost. Known metasurface manufacturing techniques include E-beam lithography, nanoimprint and immersion lithography. However, these techniques face challenges to consistently produce metasurface arrangements with structure sizes, thicknesses, positions and/or spacing in the order of tenths of nanometres with high precision at industrial scale while keeping costs low. Accordingly, the high cost and inconsistent precision of known techniques at large scales undermines the industrialization of metasurface technology, especially in a high volume manufacturing scenario.

Further, it is challenging to integrate metasurfaces on existing semiconductor optical components such as sources and detectors. For example, typically, metasurfaces are made of silicon-technology compatible materials such as TiO2, SiO2 and a-Si. They can either be integrated on silicon devices or assembled as a discrete component. However, for some optical component technologies such as III-V material optical devices such as vertical cavity surface emitting lasers (VCSEL), integration is not possible with the known silicon-technology materials portfolios of TiO2, SiO2 and a-Si. The reason for this is two-fold. First, the silicon-technology materials are incompatible with widely used, standard III-V materials technology using known mass production techniques. Second, the materials commonly used in III-V technologies are unable to provide the full 0 to $2\pi$ radians shifts or delays while maintaining high transmissivity. By way of example, to provide a full 0-$2\pi$ radians shifts, the thickness and or structure density on the metasurface may reduce transmission to 60-70%. This reduction in performance of the optical element is not satisfactory for applications where transmission levels of 90+% may be required.

Without the capability to cause an arbitrary phase shift or delay in the full range of 0 to $2\pi$ radians (or at least close to this full range), the freedom to manipulate incident electromagnetic radiation is significantly reduced. Specifically, many metasurface designs and arrangements that might rely on introducing phase shifts or delays across the full 0 to $2\pi$ radians range to cause constructive interference at predetermined distance from the metasurface would not be available to use.

Accordingly, a problem of attempting to mass produce metasurfaces using existing technologies and materials is that they are typically limited to a phase shift or delay between 0 to $\pi$ radians.

Whilst attempts have been made to overcome the above problems by experimenting with what material is used to manufacture the metasurface structures or by changing the shape of the metasurface structures. These attempts have not been successful. A disadvantage of the former is that the newly chosen materials are not compatible with mass production techniques. A disadvantage of the latter is that the structure shapes and thicknesses that might increase the phase shift capabilities of a metasurface typically cause a loss of desirable optical properties (e.g. a loss of high transmissivity and/or the introduction of polarization insensitivity). Such designs may also be impossible, too expensive, or too small/precise to be viably fabricated in mass production.

It is an aim of the present disclosure to provide an optical element and a source and a detector having such an optical element that addresses one or more of the problems above or at least provides a useful alternative.

SUMMARY

In general term, the disclosure proposes to overcome above problems by providing an optical element with two layers. One of the layers comprises a metasurface that is, in accordance with the wave theory framework that governs metasurfaces, capable of introducing a phase delay, for example, in the range of zero to IT radians in incident electromagnetic radiation or portions thereof. The other layer has a transmission region having a non-zero refractive index. In accordance with classical ray theory propagation, transmission through a non-zero refractive index medium causes a change in speed or wavelength of the electromagnetic radiation. When the electromagnetic radiation leaves the transmission region and returns to its original speed and wavelength, its phase will have shifted relative to the propagation before the transmission region. By selecting a material with an appropriate refractive index for the intended electromagnetic radiation and by selecting appropriate optical properties of the layer (e.g. a predetermined thickness or a variable thickness profile made up of multiple transmission regions of the layer), the layer may introduce a phase delay in the, or portions of, electromagnetic radiation in the additional range of 0 to $\pi$ radians. In one example, the size of the phase delay depends on the thickness of transmission region(s) of the phase shift layer. In other examples, it is also envisaged that the layer may comprise components that make up a diffractive optical element (such as a zone plate), a mirror, a lens, or other optical element known to the skilled person to introduce a phase delay into portions of the incident electromagnetic radiation. Together, the two layers thus provide an optical element that takes advantage of the non-classical, wave theory framework of metasurfaces and the classical ray theory framework of phase shift layers to provide the capability to introduce a phase delay in the, or portions of, incident electromagnetic radiation in the full range of 0 to $2\pi$ radians. The disclosure may thus advantageously be used to cause any predetermined interference pattern by shifting any portion of the electromagnetic radiation by any predetermined phase shift relative to the other portions in a manner that is mass-producible.

By providing the capability to introduce an arbitrary phase shift in the full range of 0 to $2\pi$ radians in any portion of incident electromagnetic radiation, the optical element may be arbitrarily designed to cause constructive or destructive interference at one or more predetermined distances from the optical element and/or from the optical axis of the optical element. In this way, the optical element can be configured to have the effect of, for example, a lens, a metalens, a diffractive optical element, a diffractive optical element comprising a metalens, a mirror, a mirror comprising a metalens, and/or an optical filter. Whilst the optical element may be slightly thicker than a strict metasurface or metalens alone (i.e. which does not have the above described additional, classical phase shift layer), it is still significantly thinner than traditional thick lenses, diffractive optical elements, mirrors and filters. It is also suitable for mass-production with known III-V materials technologies.

According to one aspect of the present disclosure, there is provided an optical element for introducing a predetermined phase delay into incident electromagnetic radiation, the optical element comprising: a first layer and a second layer arranged in a propagation path of a portion of the electromagnetic radiation, wherein the first layer comprises a transmission region configured to introduce a first phase delay into the portion of electromagnetic radiation propagating therethrough; and wherein the second layer comprises a metasurface configured to introduce a second phase delay into the portion of electromagnetic radiation propagating therethrough.

Accordingly, the present disclosure at least partially solves the above-described problems of practical attempts to industrialise and mass-produce metasurfaces.

A lateral extent of the transmission region may be greater than a wavelength of the incident electromagnetic radiation.

The first layer may comprise a plurality of transmission regions having respective thicknesses and arranged in respective propagation paths of respective portions of the electromagnetic magnetic radiation to introduce respective first phase delays into said respective portions, and respective lateral extents of the transmission regions may be greater than a wavelength of the respective portion of incident electromagnetic radiation propagating therethrough.

The metasurface may comprise a plurality of structures spaced apart on a surface, the structures having a lateral and/or vertical size smaller than a wavelength of the incident electromagnetic radiation and the surface being arranged in respective propagation paths of respective portions of the electromagnetic radiation to introduce respective second phase delays into said respective portions.

The respective first phase delays introduced by the plurality of transmission regions may be dependent on the respective thicknesses of the transmission regions; and the respective second phase delays introduced by the metasurface may be dependent on one or more of a: geometry of, size of, position of, and/or spacing between the structures on the surface.

At one or more predetermined distances from the optical element, the combination of the respective first and second phase delays may cause said portions of electromagnetic radiation to interfere constructively.

The thicknesses of the plurality of transmission regions of the first layer may cause the respective first phase delays to be in the range of 0 to $\pi$ radians, the one or more of: geometry of, size of, position of, and/or spacing between the structures of the metasurface of the second layer may cause the respective second phase delays to be in the range of 0 to $\pi$ radians, whereby the sum of the first phase delay and second phase delay introduced into each respective portion of electromagnetic radiation is in the range of 0 to $2\pi$ radians.

The optical element may further comprising a plurality of said first layers; and/or a plurality of said second layers.

The optical element may be one or more of: a lens, a metalens, a diffractive optical element, and/or an optical filter.

According to a second aspect of this disclosure, there is provided an energy source arranged to emit electromagnetic radiation, the energy source comprising: a light source; and any of the optical elements described above arranged in a propagation path of the emitted electromagnetic radiation.

The light source may comprise one or more of: a vertical cavity surface-emitting laser (VCSEL), a light emitting diode (LED), a resonant cavity-LED, or a surface emitting laser.

The energy source may comprise one or more semiconductor layers, and the first and second layer of the optical element may be integrated on, between, or under the one or more semiconductor layers.

According to a third aspect of this disclosure, there is provided a detector for detecting electromagnetic radiation, the detector comprising a photodetector; and any of the optical elements described above arranged between a source of the electromagnetic radiation and the photodetector.

The photodetector may comprises a photodiode.

The photodetector may comprise one or more semiconductor layers, and the first and second layer of the optical element may be integrated on, between, or under the one or more semiconductor layers.

Thus, the embodiments of this disclosure provide the above-described advantages.

BRIEF DESCRIPTION OF THE PREFERRED EMBODIMENTS

Some embodiments of the disclosure will now be described by way of example only and with reference to the accompanying drawings, in which:

FIG. 3b shows a different view of the optical element of FIG. 3a.

DETAILED DESCRIPTION OF THE PREFERRED EMBODIMENTS

In general terms, this disclosure provides an optical element for introducing an arbitrary phase delay from 0 to $2\pi$ radians into incident electromagnetic radiation or portions thereof by using metasurface layer and one classical phase shift layer.

Some examples of the solution provided by this disclosure are given in the accompanying figures.

Figures 1, 2:
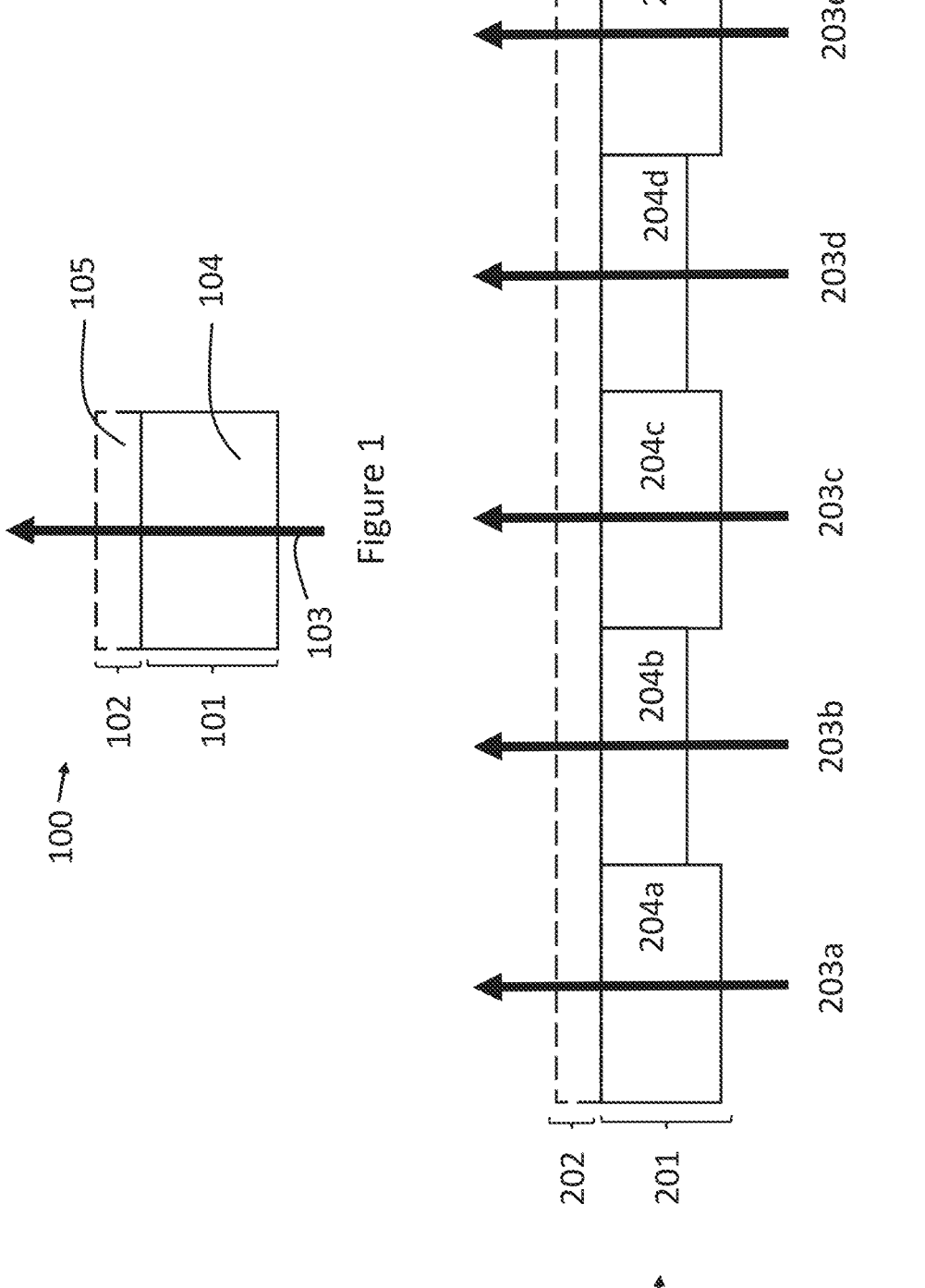
FIG. 1 shows an optical element in accordance with the present disclosure.
FIG. 2 shows an optical element in accordance with the present disclosure.

FIG. 1 shows an illustration of exemplary optical element 100 according to a best mode, the optical element 100 comprises a first layer 101 and a second layer 102 arranged in the propagation path of incident electromagnetic radiation 103, or a portion thereof. The first layer 101 comprises a transmission region 104 configured to introduce a first phase delay into the electromagnetic radiation propagating therethrough. The size of the first phase delay may be dependent on a thickness of the transmission region, and a lateral extent of the transmission region is greater than a wavelength of the incident electromagnetic radiation whereby the introduced phase delay is governed by classical optics. The second layer 102 comprises a metasurface 105 configured to introduce a second phase delay into the electromagnetic radiation propagating therethrough. The transmission region 104 of the first layer 101 may comprise a non-zero refractive index medium with a predetermined transmissivity for one or more wavelengths of electromagnetic radiation at which the optical element 100 is intended to operate. The electromagnetic radiation propagates through the non-zero refractive index medium of the transmission region 104 causing a change of wavelength and thus introducing the first phase delay relative to propagation before the optical element 100 was reached. The electromagnetic radiation then propagates through the metasurface of the second layer 102 that introduces the second relative phase delay. By selecting the thickness of the transmission region 104 and its material according to a desired refractive index, and by selecting the metasurface sub-wavelength structure size, position, and/or spacing according to predetermined metasurface design criteria, the combined first and second phase delays introduced by the optical element 100 can be arbitrarily set to be anywhere in the range of 0 to $2\pi$ radians to provide the advantages described above.

FIG. 2 shows an illustration of an exemplary optical element 200 comprising a first layer 201 and a second layer 202 such as the first and second layers described in connection with FIG. 1. The first layer 201 in the arrangement of FIG. 2 comprises a plurality of transmission regions 204a-e and may be arranged in respective propagation paths of different portions of the electromagnetic radiation 203a-e. Accordingly, as the respective portions of electromagnetic radiation 203a-e propagate through the different transmission regions 204a-e having different thicknesses, the transmission regions 204a-e introduce corresponding first phase delays into the respective portions of electromagnetic radiation 203a-e relative to each other. The respective sizes of the introduced first phase delays may be dependent on respective thicknesses of the respective transmission regions, and respective lateral extents of the transmission regions are greater than a wavelength of the respective portion of incident electromagnetic radiation propagating therethrough whereby the introduced phase delay is governed by classical optics.

When the respective portions of electromagnetic radiation 203a-e leave the first layer 201 and enter the second layer 202, a further phase delay may be introduced by the metasurface of the second layer 202. As described above, the amount of relative phase delay introduced into each portion of electromagnetic radiation 203a-e by the first layer 201 is dependent on the thickness and refractive index of the transmission region 204a-e through which that respective portion propagated. It is envisaged in the example of FIG. 2 that the transmission regions 204a-e form an integral transmission medium of material having a uniform refractive index. In other examples, where the second layer 202 comprises one or more of a diffractive optical element (such as a zone plate), a mirror, a lens, or other optical element, a phase delay based on the known classical optics treatment of these optical elements may be introduced. The amount of phase delay introduced into each portion of the electromagnetic radiation 203a-e by the second layer 202 is dependent on the design and arrangement of the metasurface sub-wavelength structures that may be based on criteria such as, for example, the size, position, and/or spacing of the sub-wavelength structures of the metasurface of the second layer 202.

It is envisaged that the respective first phase delays need not be the same as each other and the respective second phase delays need not be the same as each other. For example, to obtain a constructive and/or destructive interference pattern at one or more predetermined distances from the optical element, only some portions of the electromagnetic radiation may need to be phase delayed and/or the amount of phase delay of each portion may be different. Accordingly, the thickness and refractive index of the first layer transmission regions, and the second layer metasurface design and arrangement may be chosen so as introduce different phase delays into respective different portions to achieve the desired interference pattern.

Figure 3A:
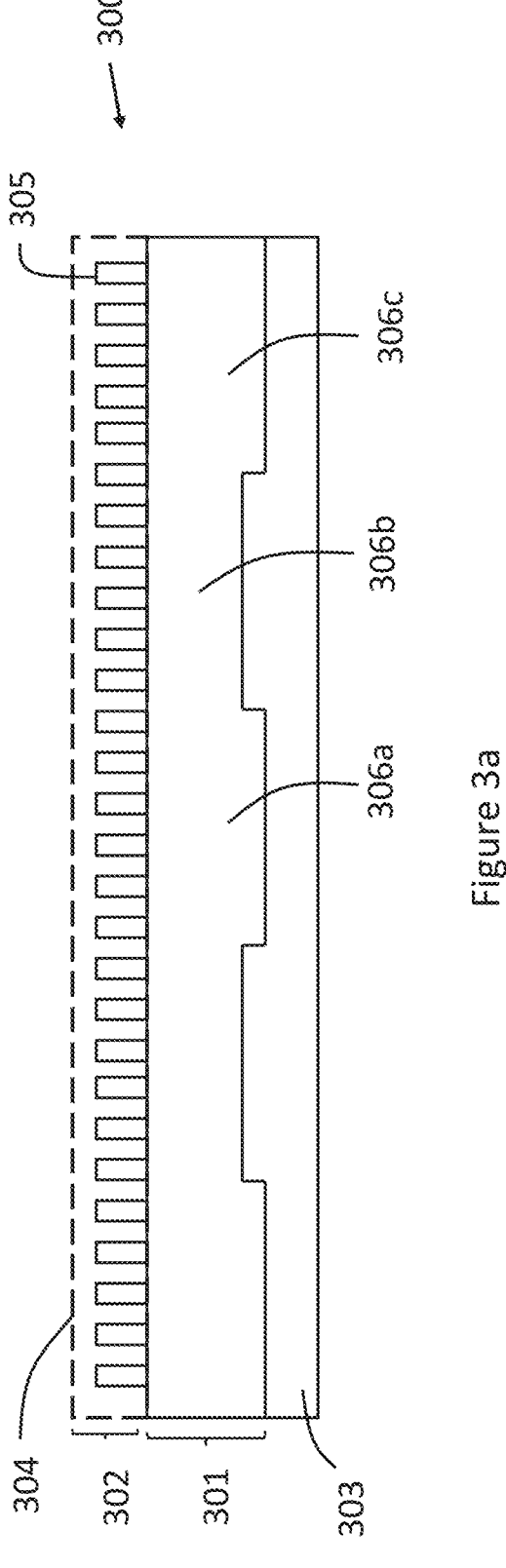
FIG. 3a shows an optical element in accordance with the present disclosure.

FIG. 3a shows an illustration of an exemplary optical element 300 that comprises a first layer 301 and a second layer 302 such as the first and second layers described in connection with FIG. 1 or 2. Optionally, the optical element 300 may further comprise a substrate 303 on which the first layer 301 and second layer 302 may be arranged. As described in connection with FIGS. 1 and 2, the first layer introduces respective first phase delays in the range of 0 to $\pi$ radians into respective portions of incident electromagnetic radiation relative to each other based on the thicknesses and refractive index of the transmission regions through which the portions of electromagnetic radiation propagate. Thus, once a suitable refractive index is chosen, the respective first phase delays introduced by the plurality of transmission regions are dependent on the respective thicknesses of those regions. By way of example, a number of transmission regions 306a-c with different thicknesses are visible in FIG. 3a. However, as described above, where the second layer comprises one or more of a diffractive optical element (such as a zone plate), a mirror, a lens, or other optical element, a phase delay will be introduced according to the known classical optical framework treatment of these optical elements. Similarly, the second layer introduces second phase delays of an additional 0 to π radians into the respective portions of incident electromagnetic radiation relative to each other. To achieve the additional 0 to π radian phase delay, the metasurface 304 of the second layer 302 comprises a plurality of structures 305 spaced apart on a surface, for example, on the upper surface of the first layer 301. The structures 305 have a lateral and/or vertical size smaller than a wavelength of the incident electromagnetic radiation and so are accordingly said to be sub-wavelength structures 305.

The surface on which the structures 305 are spaced apart is arranged in respective propagation paths of respective portions of the electromagnetic radiation to introduce the respective second phase delays as described above. Also as described above, the respective second phase delays introduced by the metasurface are dependent on one or more of a: size, position of, and/or spacing between the sub-wavelength structures of the metasurface, according to predetermined metasurface design criteria as will be appreciated by the skilled person.

Thus, when the first layer 301 and second layer 302 are combined, for example fabricated integrally using III-V materials techniques, the thicknesses of the plurality of transmission regions of the first layer 301 cause the respective first phase delays to be in the range of 0 to π radians, and the one or more of: the geometry of, size of, position of, and/or spacing between the structures of the metasurface of the second layer cause the respective second phase delays to be in the range of 0 to π radians, whereby the sum of the first phase delay and second phase delay introduced into each respective portion of electromagnetic radiation is in the range of 0 to 2π radians.

Figure 3B:
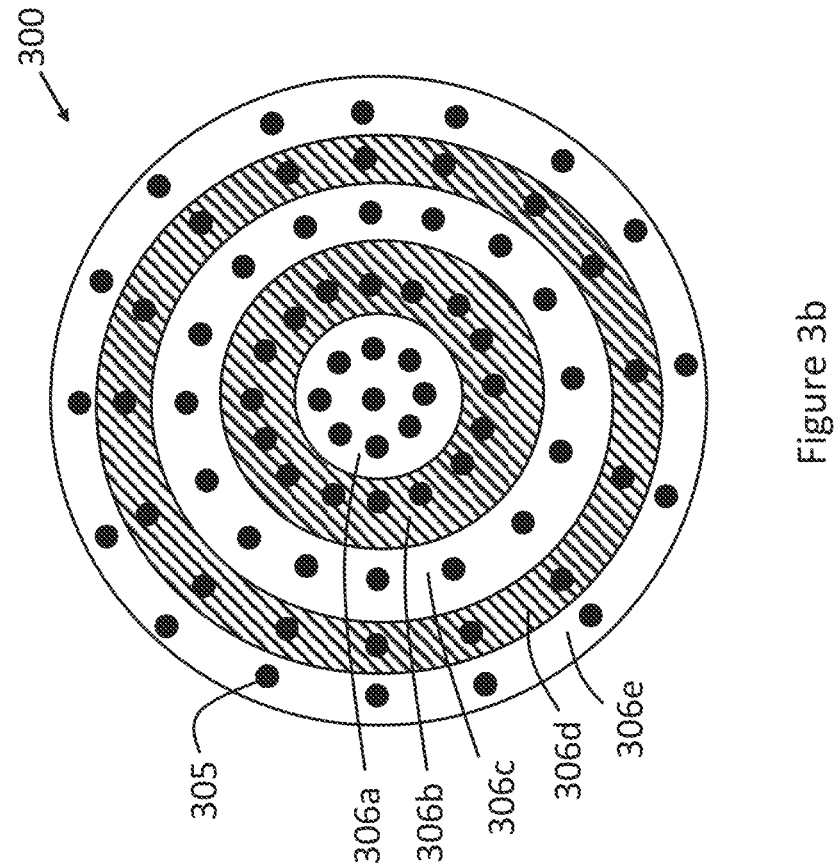

FIG. 3b shows a different view of the exemplary optical element 300 illustrated in FIG. 3a. The different transmission regions 306a-c of the first layer 301 shown in FIG. 3a are also shown in FIG. 3b together with further transmission regions 306d-e. It is envisaged that any transmission region configuration and thickness profile may be used as will be appreciated by the skilled person and accordingly the circular or concentric ring shapes of the transmission regions shown in FIG. 3b are not intended to be limiting. The transmission regions 306a-e are provided under the surface on which the sub-wavelength structures 305 (not all of which are shown) are arranged.

As described above, it is envisaged that any sub-wavelength structure number, pattern and arrangement may be used to achieve the phase delays needed as will be appreciated by the skilled person. Accordingly, the specific size, shape, pattern and arrangement of sub-wavelength structures 306a-e illustrated in FIGS. 3a and 3b, such as a plurality of circular pillars arranged with centrosymmetric symmetry, is not intended to be limiting. For example, structures with hexagonal, rectangular, triangular, and/or any other shaped section are also envisaged to be used as will be appreciated by the skilled person.

Typically, the phase delay introduced into respective portions of the electromagnetic radiation is in bijection correspondence with the geometric characteristics of the sub-wavelength structures. For example, in the case of a metasurface comprising circular pillars such as those shown in FIGS. 3a and 3b, every pillar diameter may correspond to a unique phase delay for a unique portion of electromagnetic radiation and vice-versa where pillar height and spacing is kept constant. In order to achieve a desired interference pattern at one or more predetermined distances, the structures are placed on a surface such as on the first layer described above (or on a substrate if the optical element is oriented the other way around) in a fashion such that every chosen pillar position causes the corresponding portion of electromagnetic radiation propagating through it to interfere constructively at one or more given points along the propagation path. As described above, to obtain any arbitrary interference pattern to provide maximum design freedom and as many industrial use cases as possible, the optical element must be able cause a phase delay of at least up to the full range of 0-2π radians. As described above, a problem with known metasurfaces is that, depending on the material availability, material compatibility and/or process technologies used, phase delays of more than π and up to 2π radian are not possible if high transmissivity is to be retained and known III-V materials mass-production techniques are to remain compatible. Accordingly, where the interference pattern requires the capability to introduce phase delays into some portions of the electromagnetic radiation that are higher than what can be achieved with the metasurface alone, the additional phase delay may be added by the classical phase delay layer described herein. Thus, the optical element of the present disclosure provides a phase delay layer, integrated with a metasurface, which can introduce additional phase delays as needed to achieve any arbitrary phase delay in the range of 0 to 2π radians and thereby achieve any interference pattern at one or more predetermined distances from the optical element.

Figure 3C:
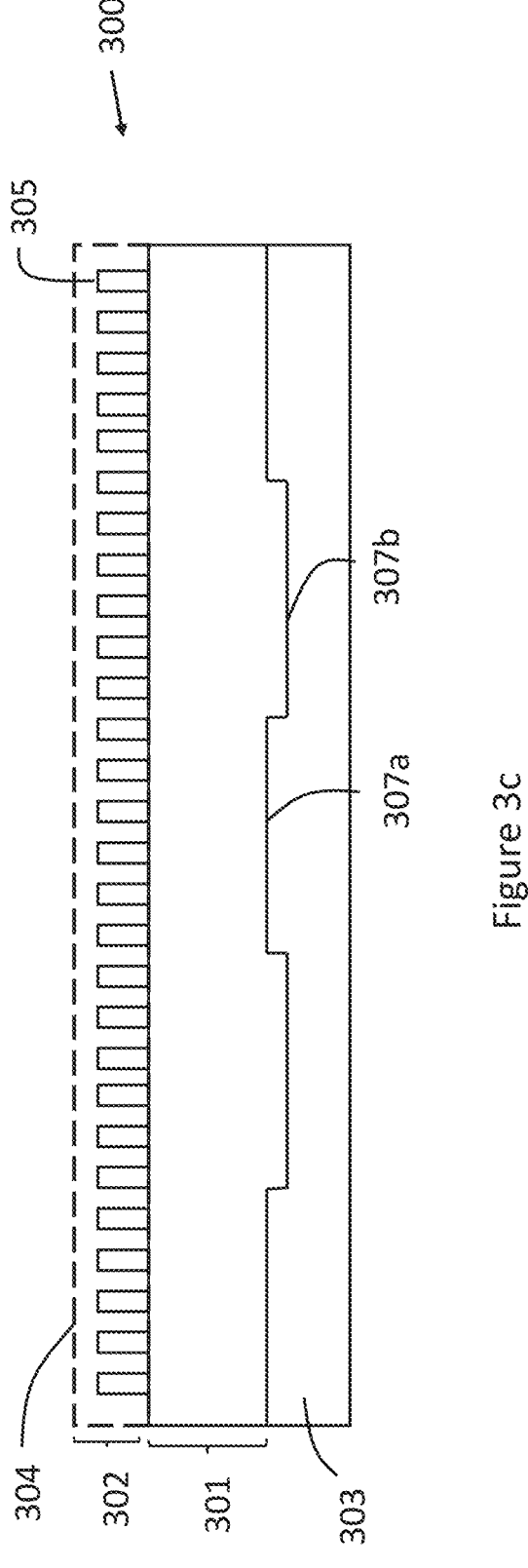
FIG. 3c shows an illustration of an optical element, which is same as the optical element of FIG. 3a and FIG. 3b but wherein the thickness profile of the first layer is the geometrical complement of the thickness profile of the first layer of FIG 3a and FIG. 3b.

FIG. 3c shows an illustration of an optical element 300, which is the same as the optical element 300 of FIGS. 3a-b but wherein the thickness profile of the first layer 301 is the geometrical complement of the thickness profile of the first layer 301 of FIGS. 3a-b. In other words, where the first layer 301 of FIGS. 3a-b has a thicker transmission region that sits in a trench in a substrate, the corresponding transmission region 307a in FIG. 3c is thinner. Conversely, where the first layer 301 of FIGS. 3a-b has a thinner transmission region, the corresponding transmission region 307b in FIG. 3c is thicker and sits in a corresponding trench in the substrate. FIG. 3c illustrates that the thicknesses of the first layer may be designed according to any required thickness profile in order to introduce any arbitrary phase delay into incident electromagnetic radiation.

It is envisaged that, for a given optical element, the desired phase delay layer thickness profile (i.e. which transmissions regions have which thicknesses) and refractive index, and the design and arrangement of the sub-wavelength structures of the metasurface will be calculated using known models and algorithms. Accordingly, once the design has been chosen, the optical element may be manufactured to that design to achieve the desired interference pattern. The interference pattern produced by the optical element cannot then be changed post manufacture. Accordingly, each transmission region and the metasurface sub-wavelength structures may be said to introduce a constant phase delay into any portion of light propagating through it.

It will be appreciated by the skilled person that existing mass-production techniques may be used to produce the present optical element. In one example, the phase delay layer may be deposited (e.g. dielectric or amorphous silicon deposition) or epitaxially grown (e.g. indium gallium phosphide) so as to provide an etch-stop layer during etching for precise thickness control. In the case where the substrate material is gallium arsenide, indium gallium phosphide provides strong edge selectivity and an efficient stopgap. These example materials and manufacturing techniques are provided as an example only and are not intended to be limiting. It is envisaged that any known materials and deposition, epitaxial, and/or etching processes suitable for III-V materials mass-production may be used to produce the optical element described herein.

Figure 4:
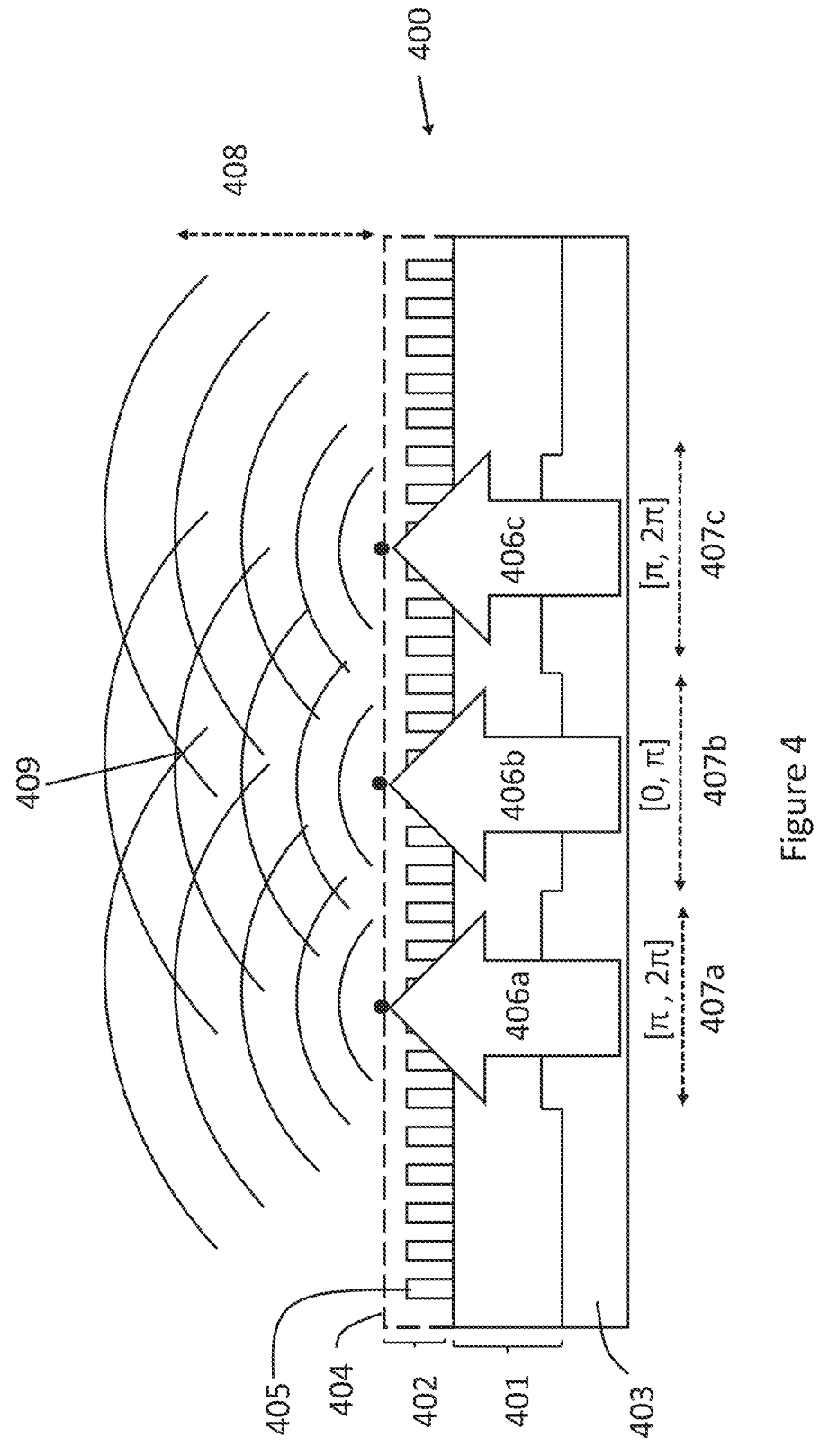
FIG. 4 shows an optical element in accordance with the present disclosure.

FIG. 4 shows an illustration of an exemplary optical element 400, for example, the optical element of FIG. 1, 2 or 3. The optical element 400 comprises a first layer 401 comprising a plurality of transmission regions of non-zero refractive index material and having varying thicknesses, a second layer 402 comprising a metasurface 404 comprising a plurality of sub-wavelength structures 405 arranged on a surface. The first and second layers 401, 402 may optionally be provided on a substrate 403. In the illustration of FIG. 4, incident electromagnetic radiation made up of three portions 406a-c is incident on the first layer 401 and propagates through corresponding different transmission regions of the first layer 401 having different thicknesses. The portions 406a-c of electromagnetic radiation then propagate through the metasurface 404 of the second layer 402 and out of the optical element 400. At one or more predetermined distances 408 from the optical element 400, the portions of electromagnetic radiation interfere to produce the predetermined interference pattern according to the design criteria of the optical element 400 as described above, for example by constructively interfering at a focal point 409 or plane like a lens. Specifically, where a phase delay of greater than $\pi$ radians is required for one or more of the portions of electromagnetic radiation to achieve the desired interference pattern, the thickness(es) of the first layer is arranged to have a thickness to provide the additional phase delay that the metasurface 404 is not able to provide alone. In the example of FIG. 4, the desired interference pattern requires a phase delay in the range of $[0, \pi]$ radians in one portion 406b of the electromagnetic radiation but a phase delay in the range of $[\pi, 2\pi]$ radians in the other portions 406a, 406c. Thus, the transmission region 407b corresponding to the portion of electromagnetic radiation which only needs a phase delay in the range of $[0, \pi]$ radians does not need to introduce an additional phase delay because the metasurface alone is capable of introducing a phase delay in this range. The thickness of this transmission region 407b is accordingly arranged not to introduce any additional phase delay (for example, it may have a zero thickness). However, the transmission regions 407a, 407c corresponding to the portion of electromagnetic radiation which need a phase delay in the range of $[\pi, 2\pi]$ radians do need an additional phase delay because the metasurface 404 alone can only introduce a phase delay of up to $[0, \pi]$ radians. Thus, the thicknesses of these transmission regions 407a, 407c are arranged to introduce an additional phase delay in the range of an additional $[0, \pi]$ radians such that the total phase delay introduced by the metasurface 404 plus the transmission regions is in the desired range of $[\pi, 2\pi]$ radians. In this way, the desired interference pattern which requires various phase delays in the range of $[0, 2\pi]$ radians can be produced.

Figure 5B:
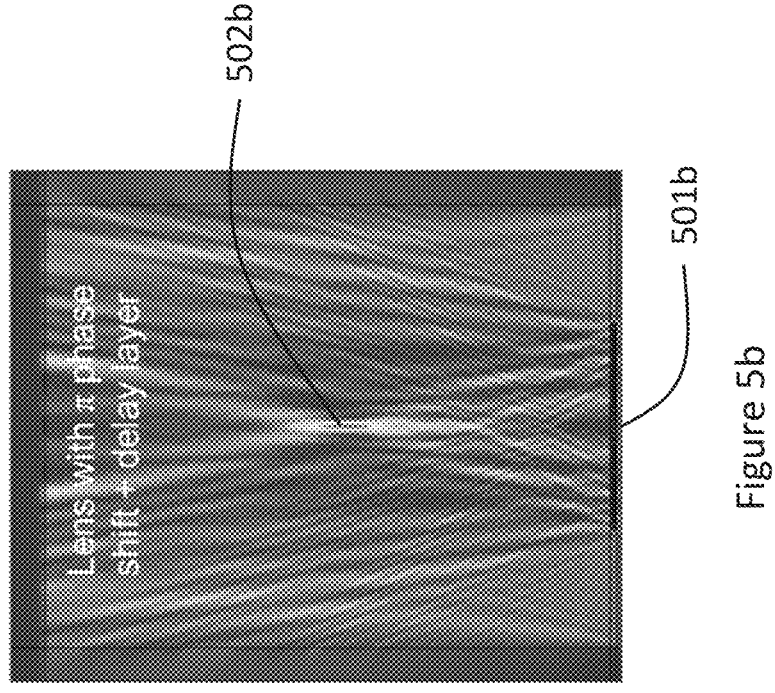
FIG. 5b shows results of a simulation in accordance with the present disclosure.
Figure 5A:
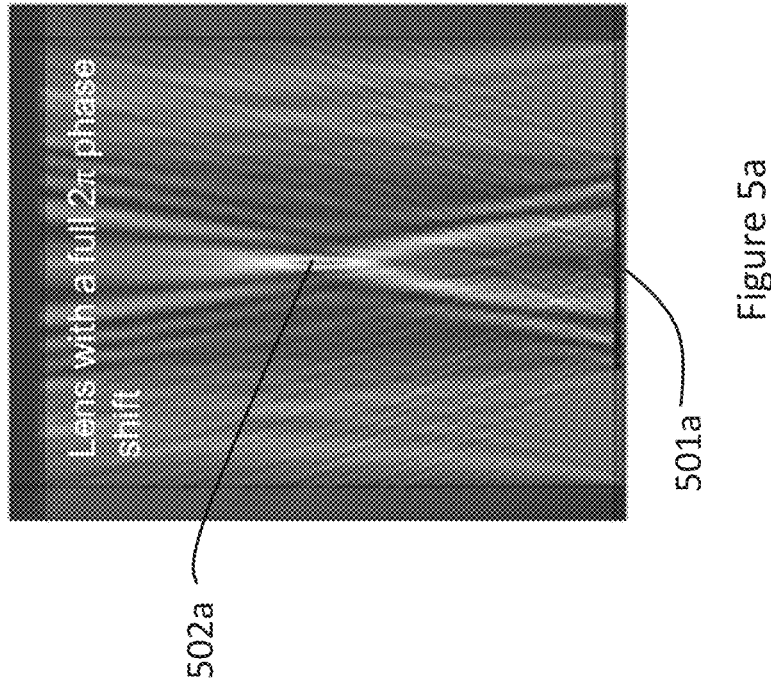
FIG. 5a shows results of a simulation in accordance with the present disclosure.

FIG. 5a shows the results of a simulation of an optical element 501a, in this case a metalens, designed to produce a predetermined interference pattern with a focal region 502a requiring phase shifts up to the full $2\pi$ radians range using a theoretical metasurface capable of introducing the required $2\pi$ radian phase delays. Mass producing the theoretical metasurface of FIG. 5a using known mass production techniques is not possible for the reasons described above and the simulation is provided for illustrative purposes only.

FIG. 5b comparatively shows the results of a simulation of an optical element 501b according to the present disclosure, for example as described in connection with FIGS. 1-4, designed to produce the same interference pattern as the hypothetical metasurface of FIG. 5a. However, unlike in FIG. 5a, the optical element comprises a metasurface able to introduce a phase shift in the range of 0 to $\pi$ radians integrated with a phase delay layer to introduce an additional phase delay of in the range of 0 to $\pi$.

FIG. 5b illustrates that the optical element 501b according to the present disclosure produces an almost identical interference pattern with a focal region 502b in approximately the same position as the hypothetical optical element 501a of FIG. 5a. However unlike the optical element 501a of FIG. 5a, the optical element 501b of FIG. 5b may be mass produced using existing mass production techniques, thereby providing a route to cheap, efficient, and quick industrialisation of metasurface technologies in a wider variety of applications than is presently viable. The dimensions of the metasurface structures will depend on the selected wavelength of the incident electromagnetic radiation. In the near infrared range, that is around 800-1000 nm, approximate structure heights may typically be in the range of 200-1000 nm, approximate spacing between structure may typically be in the range of 50 nm-700 nm, and approximate structure diameter may typically be in the range of 50-500 nm. Other ranges and other wavelengths of incident electromagnetic radiation are also envisaged. For the phase delay layer, the thickness values will depend not only on the wavelength but also in the requirements of the interference pattern desired, for example to create the effect of a lens, and/or on the requirements of the metasurface. For example, one or more transmission regions of the delay layer may have an approximate thickness ranging from around 40 nm to around 400 nm with widths of one or more transmission regions being around 200 nm up to the size of the of whole metasurface, for example around 50 um-3 mm.

Figure 6:
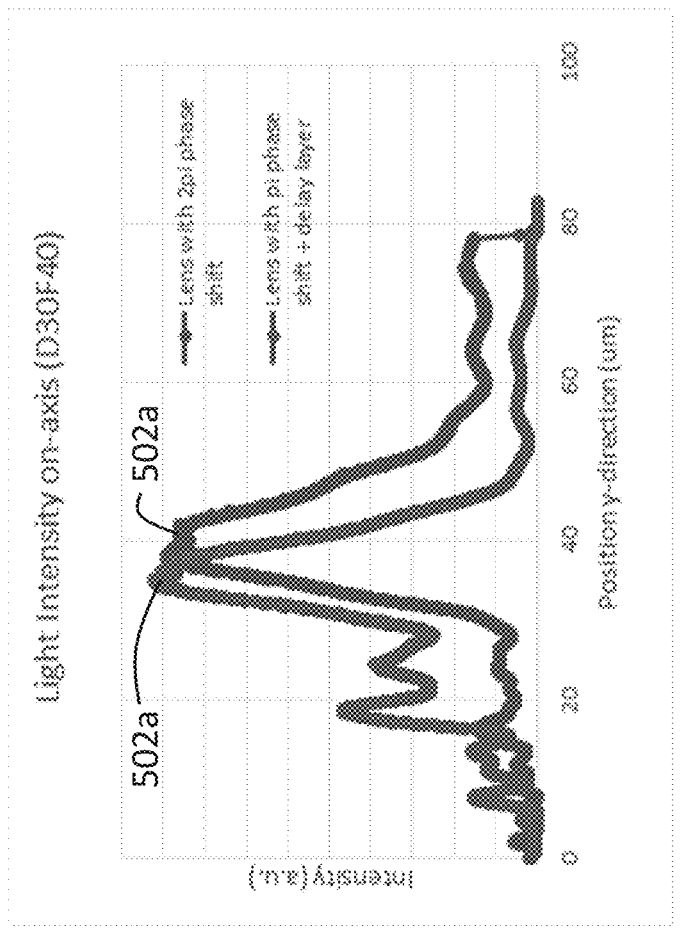
FIG. 6 shows a graph of the results of the simulation of FIGS. 5a and 5b.

FIG. 6 shows a graph of the results of the simulations of FIGS. 5a and 5b whereby an electromagnetic radiation intensity value in arbitrary units is plotted against distance from the optical element 501a, 501b in micrometres. The graph of FIG. 6 illustrates the similarity between the interference pattern produced by the optical element 501b of FIG. 5b and the hypothetical optical element 501a of FIG. 5a. Specifically, the graph of FIG. 6 illustrates that constructive interference that produces the respective focal regions 502a, 502b in FIGS. 5a and 5b occurs at approximately the same distance from the respective optical elements 501a, 501b.

Whilst the optical elements described above with reference to FIGS. 1-6 are said to comprise a single first layer and second layer, it is envisaged that a plurality of first layers and/or second layers may be arranged on top and/or interleaved with of each other to further customise and control the produced interference pattern. Thus, the optical element of the present disclosure may comprise a plurality of said first layers, and/or a plurality of said second layers.

Figure 7:
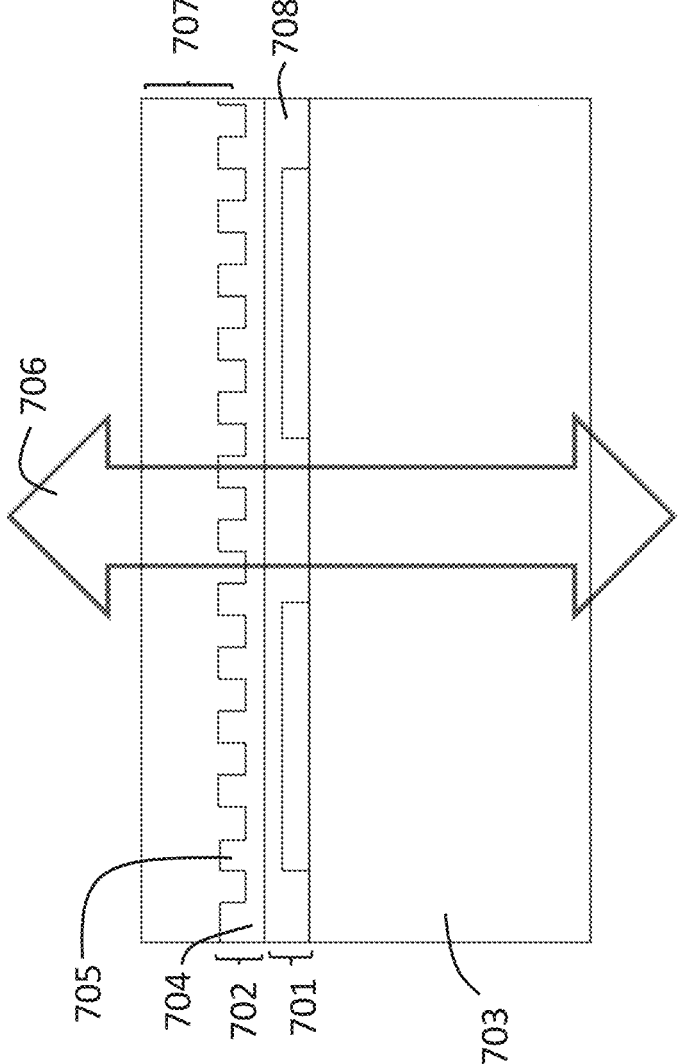
FIG. 7 shows an optical element in accordance with the present disclosure.

By way of example, FIG. 7 shows an illustration of an exemplary optical element 700, for example, similar to the optical elements described in connection with of FIGS. 1-6. The optical element 700 comprises a first layer 701 comprising a plurality of transmission regions of non-zero refractive index material and having varying thicknesses, a second layer 702 comprising a metasurface 704 comprising a plurality of sub-wavelength structures 705 arranged on a surface. The first and second layers 701, 702 may optionally be provided on a substrate 703 made of for example gallium arsenide, or for example an epitaxy material.

It is envisaged that one or more intermediate layers (not shown) in or on the substrate may comprise a semiconductor light-emitting device (such as a VCSEL, LED, and/or resonant cavity LED) to provide a source for the electromagnetic radiation incident on the first and second layers. Accordingly, the substrate may also be provided with one or more transparent layers and/or reflection layers on an emission side or reverse side. In the example of FIG. 7, the propagation axis of the electromagnetic radiation 706 generated by the envisaged light-emitting device is normal to the upper and lower surfaces of the optical element 700.

Also provided in the example optical element of FIG. 7 is an optional encapsulation material layer 707 to provide physical protection. Typically, this layer is transparent. However, where the electromagnetic radiation is intended to be reflected from the upper surface of the element and back through the element for emission from the lower surface (for example, in a back-reflector device), the encapsulation material layer 707 may comprise a metal material to enhance reflectivity.

In the example of FIG. 7, the first layer comprises multiple layers: the plurality of transmission regions and an optional intermediate layer 708 suitable for being planarized and/or chemical-mechanically polished (for example to provide a suitable surface on which to manufacture the metasurface during mass-production without damaging the underlying phase delay layer). The intermediate layer may also have a predetermined reflection and/or transmission coefficient to help with the tuning of reflection and/or transmission within the optical element.

Further, whilst the optical element of the present disclosure has generally been described herein to produce an interference pattern corresponding to a lens or metalens such that the optical element may be said to be a lens or metalens, it is also envisaged that the optical element may produce an interference pattern of one or more of a diffractive optical element, a diffractive optical element comprising a metalens, a mirror, a mirror comprising a metalens, and/or an optical filter.

Further, the optical element of the present disclosure described above in connection with all of the Figures may be integrated with one or more of such optical components during manufacture thereby further enhancing the advantage that the optical element of the present disclosure provides a cheap, efficient, and quick way to industrialise metasurface technologies using existing mass-production fabrication techniques. For example, it is envisaged that a lens or metalens may be made with the one or more first and second layers described herein. It is further envisaged that a diffractive optical element may be made with the one or more first and second layers described herein and/or may be further integrated with a metalens made with the one or more first and second layers described herein. It is further envisaged that a mirror may be made with the first and second layers described herein and/or may be further integrated with a metalens made with the one or more first and second layers described herein.

In addition, the optical element of the present disclosure may be integrated into or with other types of optical components such as energy sources and detectors.

Figure 8:
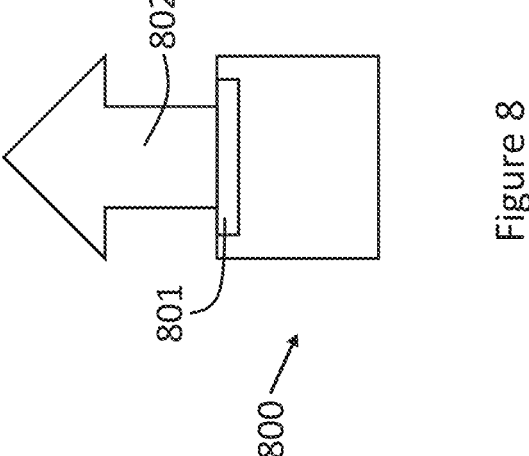
FIG. 8 shows an energy source in accordance with the present disclosure.

FIG. 8 shows an illustration of an exemplary energy source 800. The energy source is arranged to emit electromagnetic radiation 802 and comprises a light source, for example, one or more of a vertical cavity surface-emitting laser (VCSEL), a light emitting diode (LED), a resonant cavity LED, or a surface emitting laser. The energy source 800 further comprises an optical element 801, for example, an optical element described above in connection with all of the Figures. The energy source may comprise one or more semiconductor layers whereby the first and second layers of the optical element 801 are integrated on, between or under the one or more semiconductor layers such that the optical element 801 may be said to be integrated into the light source.

Figure 9:
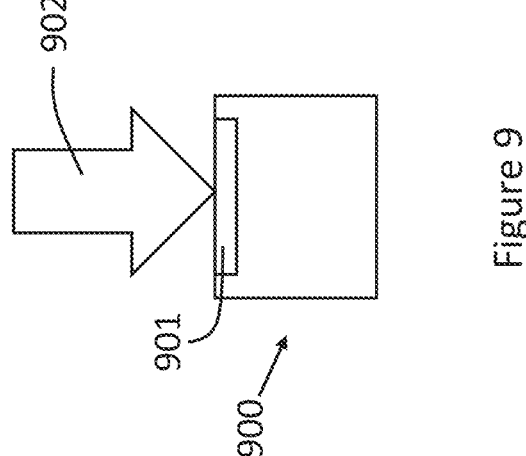
FIG. 9 shows a detector in accordance with the present disclosure.

FIG. 9 shows an illustration of an exemplary detector 900 for detecting electromagnetic radiation 902. The detector 900 comprises a photodetector, for example a photodiode. The detector 900 further comprises an optical element 901, for example, an optical element described above in connection with all of the Figures. The detector 900 may comprise one or more semiconductor layers whereby the first and second layers of the optical element 901 are integrated on, between or under the one or more semiconductor layers such that the optical element 901 may be said to be integrated into the detector.

Embodiments of the present disclosure can be employed in many different applications including, for example, in structured light, integrated optics, lens on VCSEL metalens, and/or LIDAR applications.

The skilled person will understand that in the preceding description and appended claims, positional terms such as 'above', 'along', 'side', etc. are made with reference to conceptual illustrations, such as those shown in the appended drawings. These terms are used for ease of reference but are not intended to be of limiting nature. These terms are therefore to be understood as referring to an object when in an orientation as shown in the accompanying drawings.

Although the disclosure has been described in terms of preferred embodiments as set forth above, it should be understood that these embodiments are illustrative only and that the claims are not limited to those embodiments. Those skilled in the art will be able to make modifications and alternatives in view of the disclosure that are contemplated as falling within the scope of the appended claims. Each feature disclosed or illustrated in the present specification may be incorporated in any embodiments, whether alone or in any appropriate combination with any other feature disclosed or illustrated herein.

The invention claimed is:

1. An optical element for introducing a predetermined phase delay into incident electromagnetic radiation, the optical element comprising:

a first layer and a second layer arranged in a propagation path of a portion of the electromagnetic radiation, wherein the first layer comprises a transmission region configured to introduce a first phase delay into the portion of electromagnetic radiation propagating therethrough, wherein the second layer comprises a metasurface configured to introduce a second phase delay into the portion of electromagnetic radiation propagating therethrough, and wherein the first layer comprises:

a plurality of transmission regions having constant, alternating thicknesses and arranged in respective propagation paths of respective portions of the electromagnetic radiation to introduce respective first phase delays into said respective portions, wherein respective lateral extents of the transmission regions are greater than a wavelength of the respective portion of incident electromagnetic radiation propagating therethrough.

2. The optical element according to claim 1, wherein the metasurface comprises:

a plurality of structures spaced apart on a surface, the structures having a lateral and/or vertical size smaller than a wavelength of the incident electromagnetic radiation and the surface being arranged in respective propagation paths of respective portions of the electromagnetic radiation to introduce respective second phase delays into said respective portions.

3. The optical element according to claim 2, wherein the respective first phase delays introduced by the plurality of transmission regions are dependent on the respective thicknesses of the transmission regions; and wherein the respective second phase delays introduced by the metasurface are dependent on one or more of a: geometry of, size of, position of, and/or spacing between the structures on the surface.

4. The optical element according to claim 2, wherein, at one or more predetermined distances from the optical element, the combination of the respective first and second phase delays cause said portions of electromagnetic radiation to interfere constructively.

5. The optical element according to claim 2, wherein the thicknesses of the plurality of transmission regions of the first layer cause the respective first phase delays to be in the range of 0 to $\pi$ radians, wherein the one or more of: geometry of, size of, position of, and/or spacing between the structures of the metasurface of the second layer cause the respective second phase delays to be in the range of 0 to $\pi$ radians, whereby the sum of the first phase delay and second phase delay introduced into each respective portion of electromagnetic radiation is in the range of 0 to $2\pi$ radians.

6. The optical element according to claim 1, comprising:

a plurality of said first layers; and/or a plurality of said second layers.

7. The optical element according to claim 1, wherein the optical element is one or more of: a lens, a metalens, a diffractive optical element, and/or an optical filter.

8. An energy source arranged to emit electromagnetic radiation, the energy source comprising:

a light source; and the optical element of claim 1 arranged in a propagation path of the emitted electromagnetic radiation.

9. The energy source of claim 8, wherein the light source comprises one or more of: a vertical cavity surface-emitting laser (VCSEL), a light emitting diode (LED), a resonant cavity-LED, or a surface emitting laser.

10. The energy source according to claim 8, wherein the energy source comprises one or more semiconductor layers, and wherein the first and second layer of the optical element are integrated on, between, or under the one or more semiconductor layers.

11. A detector for detecting electromagnetic radiation, the detector comprising:

a photodetector; and the optical element of claim 1 arranged between a source of the electromagnetic radiation and the photodetector.

12. The detector according to claim 11, wherein the photodetector comprises a photodiode.

13. The detector according to claim 11, wherein the photodetector comprises one or more semiconductor layers, and wherein the first and second layer of the optical element are integrated on, between, or under the one or more semiconductor layers.

* * * * *